(12) United States Patent
Landis

(10) Patent No.: US 8,212,138 B2
(45) Date of Patent: Jul. 3, 2012

(54) REVERSE BIAS PROTECTED SOLAR ARRAY WITH INTEGRATED BYPASS BATTERY

(75) Inventor: Geoffrey A Landis, Berea, OH (US)

(73) Assignee: The United States of America as represented by the Administrator of National Aeronautics and Space Administration, Washington, DC (US)

( * ) Notice: Subject to any disclaimer, the term of this patent is extended or adjusted under 35 U.S.C. 154(b) by 1315 days.

(21) Appl. No.: 11/696,441

(22) Filed: Apr. 4, 2007

(65) Prior Publication Data
US 2007/0181175 A1 Aug. 9, 2007

Related U.S. Application Data

(62) Division of application No. 10/440,378, filed on May 16, 2003, now abandoned.

(51) Int. Cl.
*H01L 31/042* (2006.01)
*H01L 31/00* (2006.01)
(52) U.S. Cl. ........................ 136/244; 136/252
(58) Field of Classification Search .............. 136/252, 136/244
See application file for complete search history.

(56) References Cited

U.S. PATENT DOCUMENTS

| 4,667,142 | A |   | 5/1987 | Butler |
|---|---|---|---|---|
| 4,740,431 | A | * | 4/1988 | Little ........................... 429/9 |
| 5,221,891 | A |   | 6/1993 | Janda et al. |
| 5,387,858 | A |   | 2/1995 | Bender et al. |
| 5,424,800 | A |   | 6/1995 | Suzuki |
| 5,500,052 | A |   | 3/1996 | Horiuchi et al. |
| 5,779,817 | A |   | 7/1998 | Wecker |
| 5,811,958 | A |   | 9/1998 | Yamamoto |
| 6,034,506 | A |   | 3/2000 | Hall |
| 6,046,402 | A |   | 4/2000 | More |

OTHER PUBLICATIONS

David J. Hoffman, Geoffrey A. Landis, Ryne P. Raffaelle, Aloysius F. Hepp, Mission Applicability and Benefits of Thin-Film Integrated Power Generation and Energy Storage, 36th Intersociety Energy Conversion Engineering Conference. Savannah, Georgia. Jul. 29-Aug. 2, 2001, pp. 1-6.

* cited by examiner

*Primary Examiner* — Basia Ridley
*Assistant Examiner* — Tamir Ayad
(74) *Attorney, Agent, or Firm* — Robert H. Earp, III; Pearne & Gordon LLP

(57) ABSTRACT

A method for protecting the photovoltaic cells in a photovoltaic (PV) array from reverse bias damage by utilizing a rechargeable battery for bypassing current from a shaded photovoltaic cell or group of cells, avoiding the need for a bypass diode. Further, the method mitigates the voltage degradation of a PV array caused by shaded cells.

10 Claims, 6 Drawing Sheets

REVERSE BIAS PROTECTED SOLAR ARRAY WITH INTEGRATED BYPASS BATTERY

CROSS-REFERENCES TO RELATED APPLICATIONS

This application is a divisional of application Ser. No. 10/440,378 which was filed on May 16, 2003, and incorporated herein by reference in its entirety.

ORIGIN OF THE INVENTION

The invention described herein was made by employees of the U.S. Government and may be manufactured and used by or for the Government for Government purposes without the payment of any royalties thereon or therefore.

BACKGROUND OF THE INVENTION

This application relates generally to the protection of photovoltaic cells from reverse bias damage.

More specifically, this application relates to protecting the photovoltaic cells of a photovoltaic (PV) array from reverse bias damage by utilizing a rechargeable battery for bypassing current from a shaded photovoltaic cell or group of cells. Further, the invention mitigates the voltage degradation of a PV array caused by shaded cells.

Photovoltaic (PV) arrays, also known as solar arrays, are typically comprised of a plurality of photovoltaic cells (also known as solar cells) arranged in series in order to increase the voltage level of a PV array to a more usable amount, typically to 28-30 volts or even 120 volts. A plurality of series connected PV cells can then be connected in parallel to increase the current (and power) capability of the PV array. PV arrays are used extensively for terrestrial, orbital, and extra-terrestrial (e.g., planetary or interplanetary) uses.

These individual photovoltaic cells are typically constructed of a crystalline or amorphous silicon, or some other semiconductor material, such as the commonly used Gallium Arsenide (GaAs). When exposed to sunlight, these PV cells typically generate a voltage ranging from 0.50 to 2.5 volts each, depending on the materials used. The voltage of the PV portion of the device is determined by the nature of the p-n junction of the photovoltaic cell, or, in other words, the materials used. In the case of a GaAs homo-junction device this will be around 1.0 V. For thin-film a-Si or CuInSe2 (CIS) PV, the voltage generated will be somewhat less (0.4-0.8 V). Accordingly, strings of 30 or more photovoltaic cells are typically strung in a series to form a solar array in order to gain the desired output voltage.

Individual arrays of a series connected plurality of PV cells may then be placed in parallel in order to increase the total current and power capacity of the resulting entire PV array. A multiplicity of such arrays could further be combined to increase the power availability even more. The voltage output of individual arrays or the combination of arrays can then be modified using a DC-to-DC converters and/or a DC-to-AC inverters to generate a voltage useful for the typical electrical loads to be powered.

However, a problem arises when individual cells of the series connected photovoltaic cells are not generating electricity, such as when some subset of cells is shaded, for example. Because the current through series connected PV cells must pass through each cell in the series, if one or more individual PV cells are shaded, the current generated by the unshaded cells in the solar array must pass through the shaded cells as well.

This current through the shaded cell(s) results in a reverse bias across the cell, and can lead to "hot-spot" heating, which can damage the shaded cell. This problem is well-known in the art, and is also called "reverse-bias degradation", "breakdown", "shading", and "shadowing" effects, for example. In the extreme, such "hot-spot" heating can destroy a photovoltaic cell, and thus degrade the array, or make it useless.

FIG. 1 shows a graphical example of such "hot-spot" heating, with curve 14 showing the operating points of 30 unshadowed cells (with point 14 representing the operating point with a partially shadowed cell) and with curve 11 representing the single, partially shadowed cell, operating far at the reverse bias point 12. Line Z represents a constant current line, and line H the nominal operating voltage. Quadrant A represents a reverse-bias, power dissipating area whereas quadrant B represents the power generating forward bias area.

Most localized shadowing, however, is transient, lasting only seconds or minutes. Shadowing of the entire solar array is not relevant to the above problem, because only partial or uneven shadowing leads to the "hot-spot" heating effect.

Conventional approaches for protecting the individual cells of a solar array include putting a "bypass diode" in parallel with each photovoltaic cell. FIG. 2 shows such an implementation. The bypass diode then shunts the series current of the solar array from the one or more cells that are shaded, protecting the shaded cells from damage.

Nevertheless, there are undesirable side-effects to this traditional approach. For example, the entire solar array loses operating voltage whenever one or more cells is shadowed. The amount of this voltage degradation is determined from the voltage no longer generated by the individual shaded cell(s), plus the turn-on voltage of the corresponding bypass diode(s), typically leading to a net voltage drop across the shaded cell, in contrast to the typical voltage rise of a voltage generating, unshaded cell. If the voltage of the solar array drops below the required bus voltage of the solar array, the entire array may not produce useful power. In practice, a shadow of as little as one percent might block one-hundred percent of the solar array output.

Accordingly, an approach that can overcome the above identified shortcomings would be desirable.

Further, it would be useful to utilized thin-film manufacturing processes for implementing the invention. Thin-film photovoltaic (TFPV) power generation has been under development for some time. TFPV sample cells and panels have flown in space. The principle benefits of TFPV arrays include very high mass specific power (W/kg), radiation tolerance and good stowability. The mission benefits of TFPV solar arrays have been identified, and may be realized when full scale TFPV arrays are constructed and space qualified.

In comparison to TFPV power generation, thin-film energy storage (TFES) is a relatively recent development. Very small thin-film lithium-ion batteries have been developed and tested in the lab for use in multi-chip modules (MCMs). With a typical operating range between 3.0 V and 4.2 V, the useable capacity of these initial TFES batteries is very small, ranging from 0.2 to 10 mAh/cm2. The energy capacities of thin-film batteries are typically too low to allow thin-film batteries to serve as primary energy storage for an array, but, can prove useful to solving some of the problems identified above.

Because of the similarity in the materials and processes that go into TFPV and TFES devices, it is practical to consider a combination of the two technologies. Further, a solution that in addition to providing protection against hot-spot heating, also enables some energy storage capability for momentary shading of the entire array, would add desirable additional benefit to the design.

SUMMARY OF THE INVENTION

Provided is a photovoltaic array comprising a photovoltaic battery including a photovoltaic cell and rechargeable battery connected in parallel with the photovoltaic battery, wherein, when the photovoltaic cell is shaded, the rechargeable battery shunts an array current including current not generated by said rechargeable battery from the photovoltaic cell that is shaded.

Also provided is a photovoltaic array comprising a plurality of photovoltaic modules connected in series, each photovoltaic module including a photovoltaic battery having a photovoltaic cell; and a rechargeable battery having a rechargeable cell and connected in parallel with the photovoltaic battery.

Further provided is a photovoltaic array comprising: a photovoltaic battery including a photovoltaic cell; and a rechargeable battery connected in parallel with the photovoltaic battery. When the photovoltaic cell is shaded, the rechargeable battery is used for compensating for a voltage drop of the photovoltaic battery due to the shaded photovoltaic cell while the photovoltaic array is generating useable power from light.

Still further provided is a photovoltaic module comprising a photovoltaic battery including a photovoltaic cell and a rechargeable battery connected to the photovoltaic battery for shunting a current from the photovoltaic battery when the photovoltaic cell is shaded to protect the photovoltaic cell.

Even further provided is a photovoltaic array comprising a photovoltaic battery including a plurality of photovoltaic cells connected in series; and a rechargeable battery including at least one rechargeable cell and connected in parallel with the photovoltaic battery. When one or more of the plurality of photovoltaic cells is shaded, the rechargeable battery shunts an array current of the photovoltaic array from the photovoltaic battery to protect the one or more shaded photovoltaic cells from damage from the array current while the photovoltaic array is generating power from light.

And provided is a photovoltaic array comprising: a plurality of photovoltaic modules connected in series. Each photovoltaic module includes: a photovoltaic battery having one or more photovoltaic cells connected in series; and a rechargeable battery having one or more rechargeable cells connected in series.

The rechargeable battery is connected in parallel with the photovoltaic battery. The rechargeable battery is for shunting an array current of the photovoltaic array from the photovoltaic battery when at least one of the photovoltaic cells is shaded to protect the shaded photovoltaic cells from damage from the array current while the photovoltaic array is generating power, and the rechargeable battery is also for compensating for a voltage drop of the shaded photovoltaic cells while the photovoltaic array is generating useful power.

And even further provided is an integrated power supply comprising a photovoltaic cell; and a rechargeable battery connected to the photovoltaic cell. The rechargeable battery is integrated with the photovoltaic cell on a thin-film substrate.

Additionally provided is an integrated power supply comprising a photovoltaic battery including a photovoltaic cell; and a rechargeable battery including a rechargeable cell. The rechargeable battery is connected in parallel with the photovoltaic battery, and the rechargeable cell is integrated with the photovoltaic cell on a thin-film substrate.

Also provided is an integrated power supply comprising a plurality of modules connected in series. Each module includes: a photovoltaic battery including one or more photovoltaic cells; a rechargeable battery including one or more rechargeable cells; and a blocking diode for connecting one terminal of the photovoltaic battery to one terminal of the rechargeable battery (such as connecting the diode in series with the photovoltaic battery, for example).

The rechargeable battery is connected in parallel with the photovoltaic battery, and the rechargeable battery is for shunting a current of the photovoltaic array from the photovoltaic battery when one or more of the photovoltaic cells is shaded to protect the one or more of the plurality of photovoltaic cells that are shaded from damage from the current while the photovoltaic array is generating power from light.

The rechargeable battery is also for compensating for a voltage drop of the shaded photovoltaic cell while the integrated power supply is generating power from light, and the rechargeable cells are integrated with the photovoltaic cells on a thin-film substrate.

Each module also includes conditioning and control electronics for conditioning and controlling a charging and/or discharging current of the integrated power supply.

And further provided is a photovoltaic array comprising a plurality of PV modules connected in series. Each PV module includes: a photovoltaic battery having one or more photovoltaic cells connected in series; a rechargeable battery having one or more rechargeable cells connected in series, and a blocking diode for connecting an electrode of the photovoltaic battery connected to an electrode of the rechargeable battery. The rechargeable battery has another electrode connected to another electrode of the photovoltaic battery, and the blocking diode prevents the rechargeable battery from discharging through the photovoltaic battery.

DETAILED DESCRIPTION OF THE PREFERRED EMBODIMENTS

Figure 1:
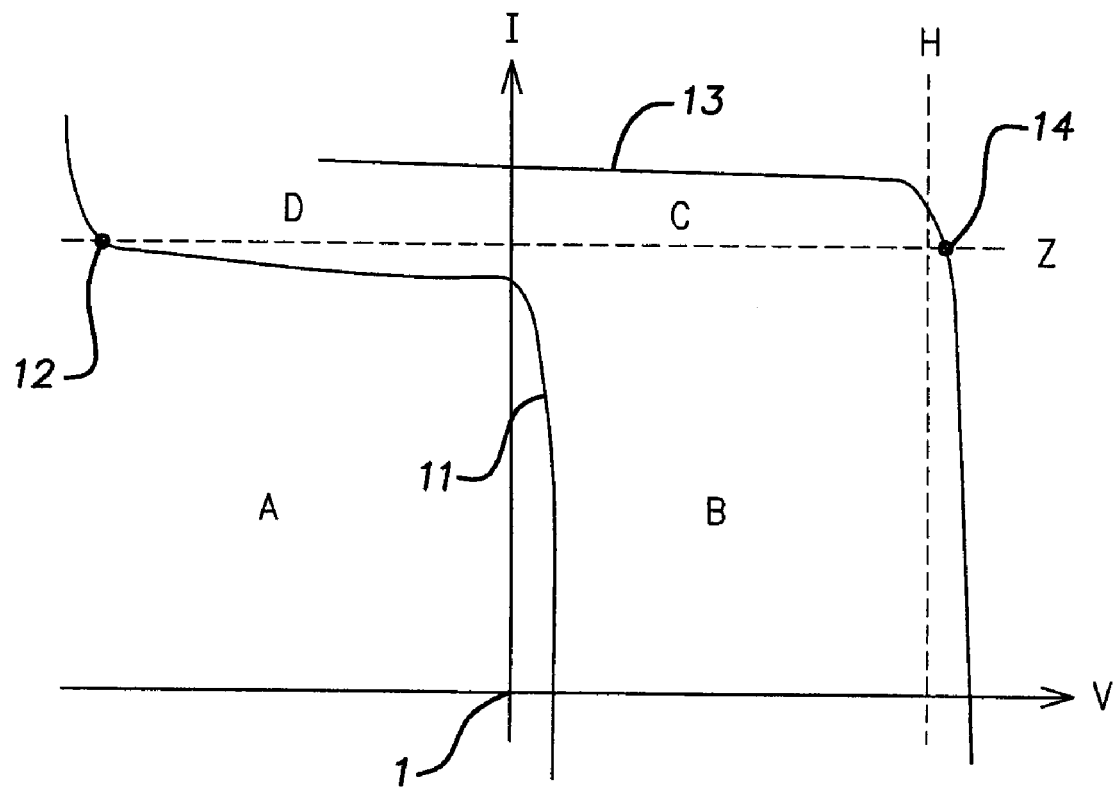
FIG. 1 shows the graph of current as a function of voltage for a photovoltaic array, and shows as a graphical plot the reverse-bias "hot spot" heating on a shaded PV cell.
Figure 2:
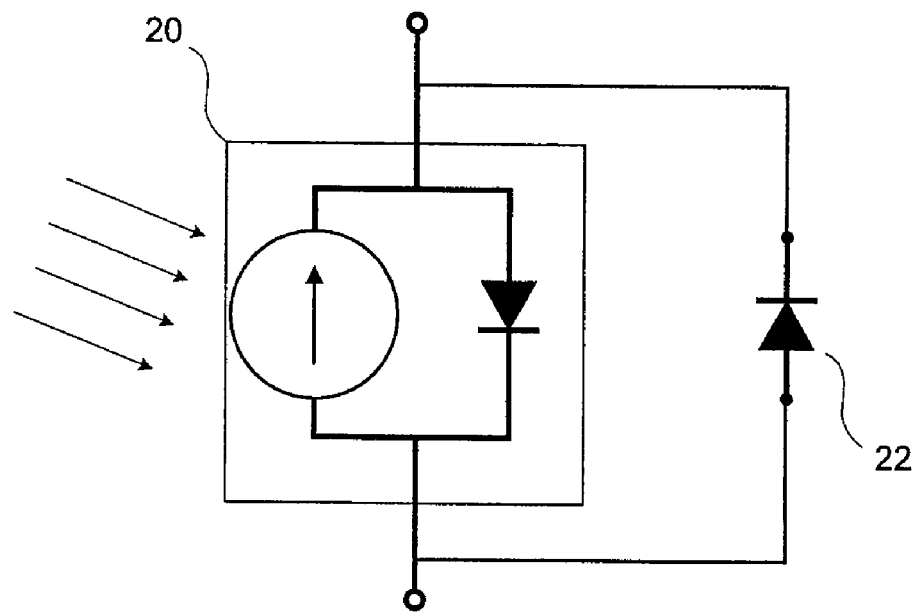
FIG. 2 shows a PV cell protected by a bypass diode.

FIG. 2 shows the traditional means of protecting a solar array from shadowing effects which can cause hot-spot heating as shown in the graph of FIG. 1. (Note that a single photovoltaic cell is conventionally represented in a circuit diagram as a current source plus a diode, where the diode represents the p-n junction, an integral part of the cell) In this means of shadow protection, the photovoltaic cell 20 is paralleled with a bypass diode 22. A number of such cells, each with bypass diode, is then connected in series to form a photovoltaic array. As discussed in the Background section above, however, such an implementation has undesirable side-effects.

Figure 3:
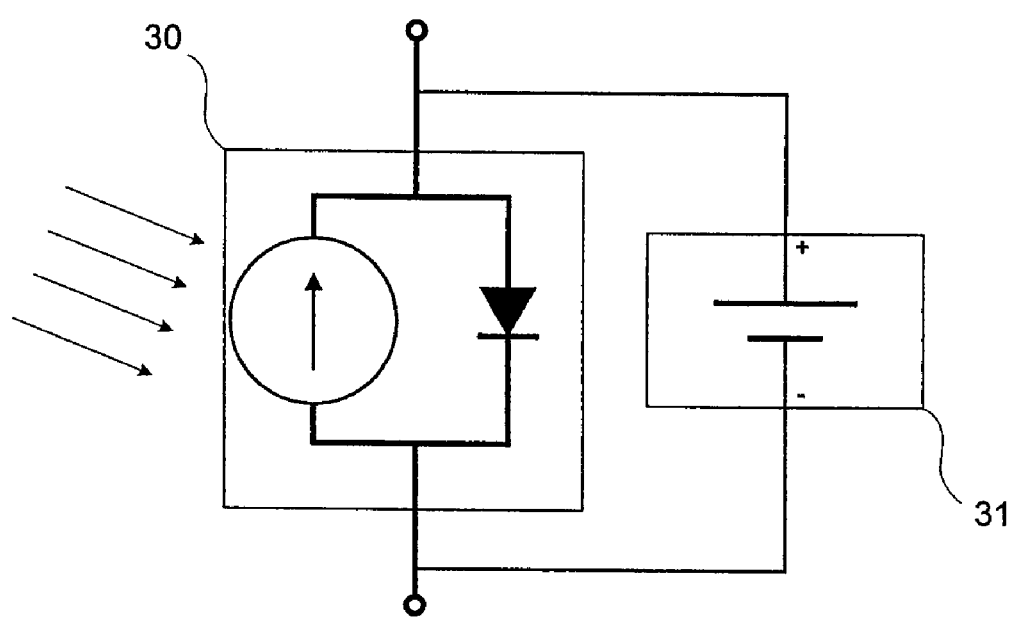
FIG. 3 is a schematic of an embodiment of the invention showing a rechargeable battery in parallel with a PV cell.

Disclosed herein is a means of preventing hot-spot heating during transient shadow by placing a rechargeable battery 31 in parallel with the photovoltaic cell 30, as shown in FIG. 3. In the resulting design, the "hot-spot" destruction of a shadowed photovoltaic cell can be avoided without using a bypass diode. The battery is charged by the normal, sunlit operation of the photovoltaic cell, but when the photovoltaic cell is shadowed, the majority of the solar array current flows through the battery instead of the photovoltaic cell, thereby protecting the PV cell.

For example, a typical transient shadow on a spacecraft (such as an antenna shadow) may last for about two minutes. The eclipse time for a spacecraft in low orbit, for comparison, is about 40 minutes. If the array provides one amp of current, shadow protection by a diode will require a battery of storage capacity 33 milliamp-hours, while providing a storage for eclipse power requires a battery of storage capacity 667 milliamp hours. Thus, it is clear that the shadow protection function can be accomplished by a battery of considerably lower storage capacity than that required for eclipse power. (However, if the battery also is large enough in capacity to provide eclipse power, this would be an added benefit). For use on the surface of the Earth, the situation is even worse. Using a battery to provide 12 hours of night-time power would require 12,000 milliamp-hours of storage, considerably more than the 33 milliamp-hours required to provide protection for a two minute shadow.

In addition, because the rechargeable battery 31 generates a voltage of its own, the degradation of the voltage of the series connected array can be greatly reduced to only the difference between the typical shaded PV cell voltage when in sunlight and the battery voltage. This voltage difference can be minimized by closely matching the battery voltage of the chosen battery to that of the chosen individual photovoltaic cell generating voltage. Because there are alternative battery and solar cell designs available, many potential embodiments exist. Close matching also ensures that the photovoltaic cell 30 does not overcharge, and thus damage, the rechargeable battery 30. Alternatively, protective circuits incorporated within the device (such as within the battery) could prevent battery overcharging or maintain the desired battery voltage.

Of course, this lack of voltage degradation lasts only as long as the rechargeable battery can maintain its charge. As the battery charge is depleted, the array voltage will begin to degrade. However, because most cell shadowing during array use is transitory, by choosing batteries of sufficient energy storage capability, the array can be designed to avoid such degradation under most circumstances.

Figure 4:
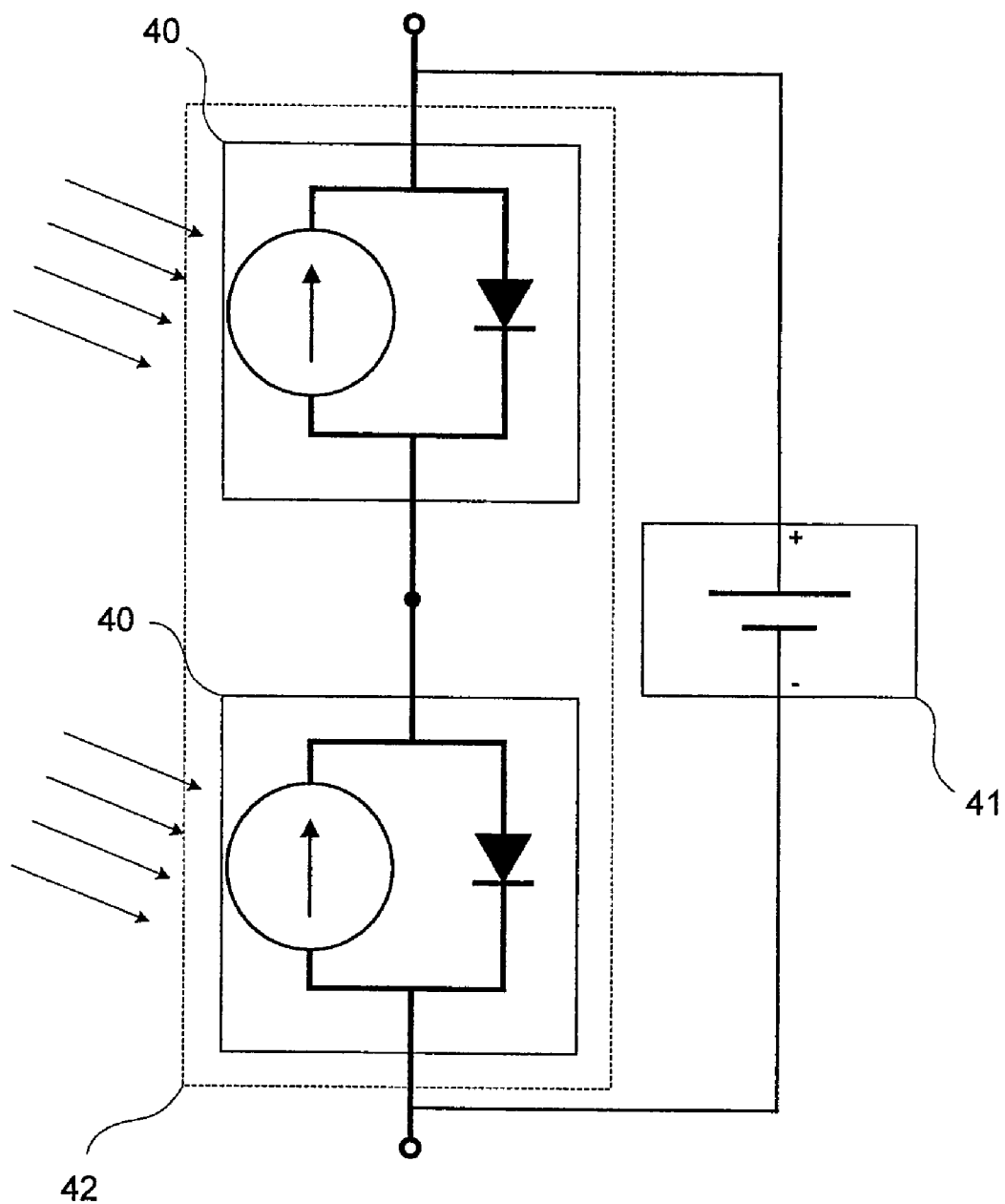
FIG. 4 is a schematic of another embodiment showing a rechargeable battery connected in parallel with a serially connected pair of PV cells.
Figure 5:
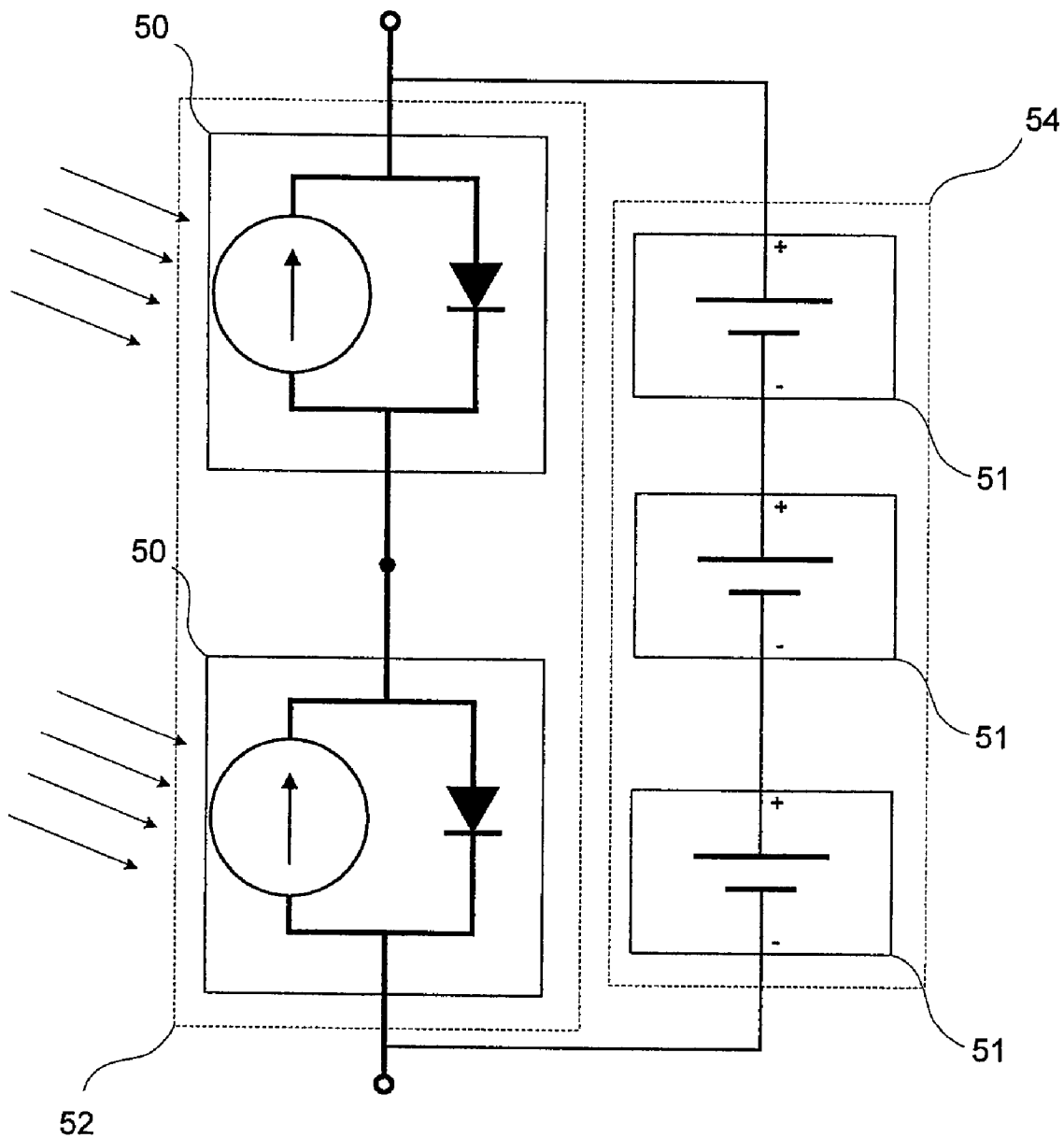
FIG. 5 is a schematic of still another embodiment showing a plurality of series connected rechargeable cells forming a rechargeable battery connected in parallel with a pair of series connected PV cells forming a PV battery.
Figure 6:
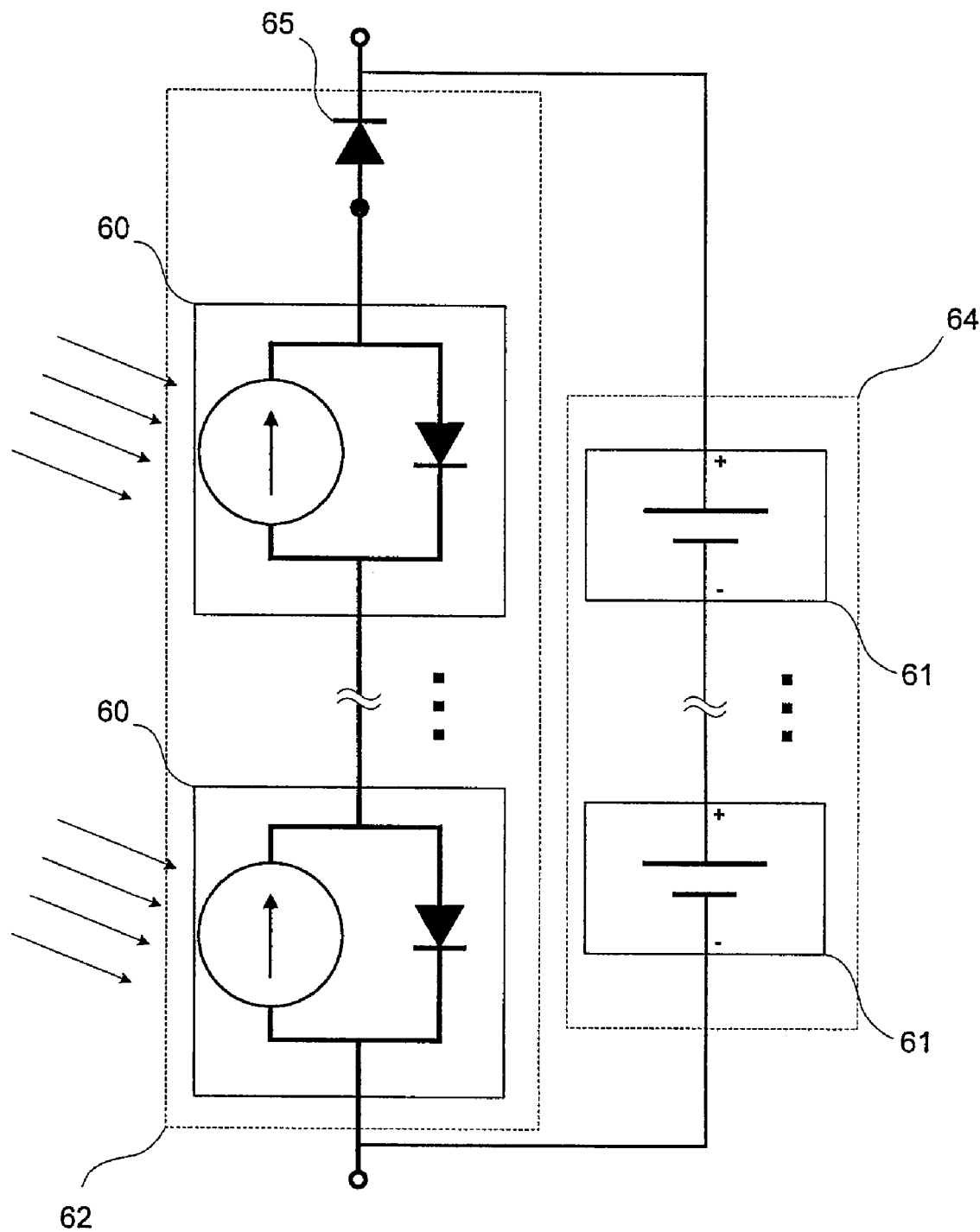
FIG. 6 is a schematic of a generic embodiment with a to be determined number of PV cells forming a PV battery and a to be determined number of rechargeable cells forming a rechargeable battery.

Unfortunately, matching battery voltages to photovoltaic cell voltages can be problematic. Thus, examples of alternative configurations are shown in FIGS. 4, 5 & 6. These configurations all show a basic photovoltaic module using a photovoltaic battery with one or more photovoltaic cells connected in series. Further, the photovoltaic battery may have additional protection and/or conditioning circuits. The photovoltaic module also uses a rechargeable battery having one or more rechargeable cells connected in series. Again, the rechargeable battery may have additional conditioning and/or protection circuits. The rechargeable battery is then connected in parallel to the photovoltaic battery. Additional electronics could be added to the module for conditioning and/or protection instead of, or in addition to, any additional electronics in either of the batteries.

FIG. 4 shows a particular photovoltaic module with a rechargeable battery 41 placed in parallel with a pair of series connected photovoltaic cells 40 (the PV cells 40 thereby forming a photovoltaic battery 42). Thus, a single rechargeable battery 41 protects the photovoltaic battery 42 comprising the series-connected pair of photovoltaic cells 40. This approach allows the rechargeable battery voltage to be approximately double the individual photovoltaic cell voltages.

As an example of an implementation of FIG. 4, one 4.2 Volt Lithium $CoO_2$ rechargeable battery could protect a pair of 2.1 Volt dual-junction series connected photovoltaic cells.

A further alternative would be to use more than one series connected rechargeable cell (forming a rechargeable battery) to protect a single photovoltaic cell. Thus, even more flexibility can be provided for engineering an optimum solution. An example of this implementation would be using two 1.2 Volt series connected NiCd or NiH battery cells to protect a single 2.5 Volt triple-junction photovoltaic cell.

FIG. 5 shows another alternative photovoltaic module using two series-connected photovoltaic cells 50 (forming a photovoltaic battery 52) with three series-connected rechargeable cells 51 (forming a rechargeable battery 54). The photovoltaic battery 52 is connected in parallel with the rechargeable battery 54. For this implementation, each rechargeable cell 51 should have a charged voltage of about 2/3 of the voltage of a single photovoltaic cell 50. Thus, the rechargeable battery 54 comprised of the series of three rechargeable cells 51 should have approximately the same voltage as the photovoltaic battery 52 comprised of the series of two photovoltaic cells 50.

Finally, FIG. 6 shows a flexible generic configuration of a photovoltaic module having a to-be-determined number of PV cells 60 and a to-be-determined number of rechargeable cells 61. The number of PV cells and battery cells, which do not have to be equal, is determined using the design constraints discussed above and below. However, a design using a single PV cell and/or a single rechargeable battery cell as shown in FIG. 3 could also be utilized.

Thus, FIG. 6 allows for additional variations to utilize various numbers of photovoltaic cells connected in series to form a photovoltaic battery, and then connected in parallel to one or more rechargeable cells connected in series forming a rechargeable battery. In this manner, rechargeable battery voltage 64 can be accurately matched to the photovoltaic battery voltage 62, allowing a wide variation of rechargeable cell and/or photovoltaic cell design materials to be utilized and voltages to be closely matched. An optional blocking diode 65 can be made part of the photovoltaic battery, for example, to prevent the rechargeable battery 64 from discharging through the photovoltaic battery 62. A blocking diode could be utilized in any of the embodiments discussed above in a similar manner for the same reason.

Still, care must be taken to ensure that the final approach does not result in too many photovoltaic cells in series being protected by a rechargeable battery because of the potential of hot-spot heating. If only a single photovoltaic cell of a protected series is shadowed, there would be a reverse-bias voltage on that shadowed cell equal to the voltage generated by the unshadowed photovoltaic cells of that series. If too many photovoltaic cells are utilized in series, then damage to the shadowed cell is again possible due to hot-spot heating.

Accordingly, there will likely be an upper limit on the number of photovoltaic cells that can be safely and serially connected together to be connected to a rechargeable battery. That upper limit will depend on the type of photovoltaic cell and its material composition, for example. Thus, care must be taken in determining how many serial photovoltaic cells should be protected by a single rechargeable battery cell or series of rechargeable cells. The optimum number will depend on the materials chosen for the photovoltaic cells and the desirable rechargeable battery choice. Hence, engineering tradeoffs must be made. In practice, then, the greatest protective benefit is likely to be obtained when the number of cells series connected and protected by a single battery or string of series-connected cells is about five or fewer.

Finally, a photovoltaic array is created by stringing any number of photovoltaic modules together in series, forming a series array. Further, any number of series arrays could also be connected in parallel to form an even higher current/power array. In this manner, the photovoltaic modules become building blocks for building photovoltaic arrays, and thus provide great flexibility in forming a variety of array sizes and capacities for various applications. At the same time, any shaded photovoltaic cells in a given module are protected from hot-spot heating damage by the current bypassing action of the corresponding rechargeable battery. In this manner, no bypass diodes need be integrated with the photovoltaic cells to protect them.

Figure 7:
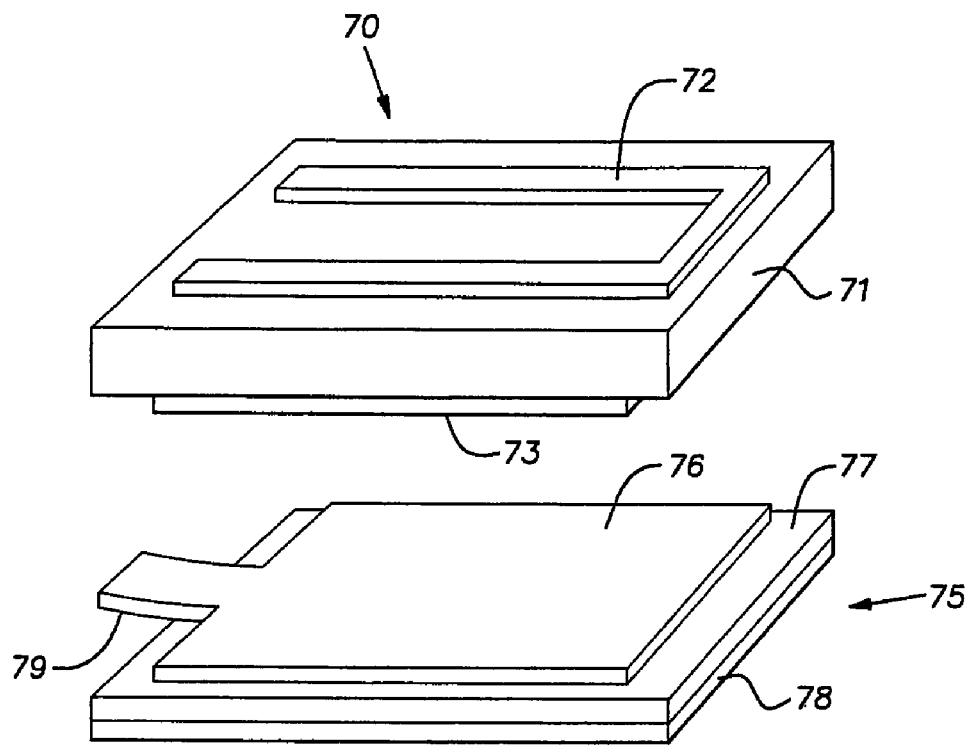
FIG. 7 is a representation of the thin-film PV cell and rechargeable battery cell.
Figure 8:
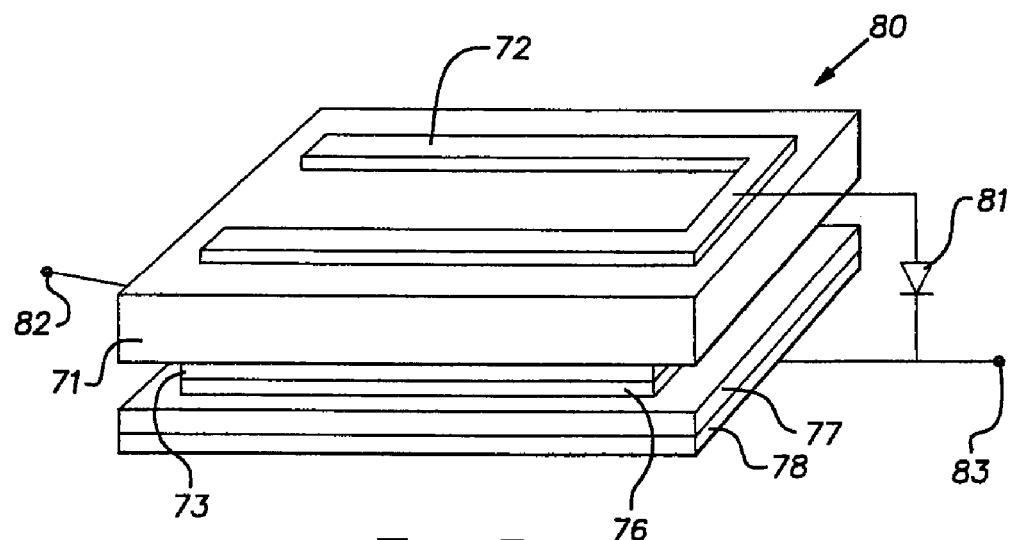
FIG. 8 is a representation of the schematic of FIG. 3 using the thin-film representation of FIG. 7 and adding a blocking diode.

A further enhancement of the invention is to use rechargeable thin-film battery technology in conjunction with photovoltaic cell fabrication processes to integrate the thin-film battery with the photovoltaic cell on a substrate as shown in FIG. 7, which shows a photovoltaic cell 70 having the semiconductor layer(s) 71 covered by a front metalization layer 72 and a back metalization layer 73 for providing the battery electrodes. This photovoltaic cell 70 can be combined with a thin-film battery 75 having a negative (anode) layer 76, a electrolyte layer 77, and a positive (cathode) layer 78. These can be combined as shown in FIG. 8 to form an Integrated Power Supply (IPS), with electrical connections 82 and 83 to allow the integrated power supply to be connected in series with additional IPS units to form an array. Optionally, a blocking diode 81 may be used to prevent the battery from discharging through the PV array during eclipse. A blocking diode is most useful to protect across multiple IPSs and less beneficial if one is put on each IPS. A tab 79 is shown indicating the electrical connection to the center layer of the sandwich.

The battery in this example FIG. 8 is shown with the negative (cathode) layer on the top side in contact with the solar cell back metallization; however, the configuration of battery with the positive layer connected to the solar cell back metallization can also be used, and is preferable for the n on p polarity of cell. If an electrically insulating layer is used between the solar cell back metallization 73 and the battery, then either configuration (anode on top or cathode on top) will function. If the solar cell back metallization is electrically connected to the battery, then the preferred configuration for a p-on-n type solar cell is to have the negative battery electrode on the side in contact with the solar cell; and for the n on p polarity of cell the configuration of battery with the positive layer connected to the solar cell back metallization is preferable.

Because of the similarity in the materials and processes that go into TFPV and TFES devices, it is practical to consider combination of the two to practice the invention. It is feasible to combine a TFPV cell on a substrate material (such as Kapton® made by DuPont, for example) with a Li-ion thin-film battery sandwiched in the substrate material. With the further addition of very small power conditioning and control electronics, a compact and useful Integrated Power Source (IPS) is possible.

The voltage of a Li-ion battery is based on its chemistry and is primarily determined by the material used in its cathode. A vanadium pentoxide or manganese oxide battery will have an open circuit voltage of 3.0 V, whereas a nickel cobalt cell will be 4.2 V.

In a way similar to PV cells, Li battery cells can be connected in series configurations to produce different voltages. However, the amount of energy that can be stored in a cell, its capacity, is determined primarily by its volume. Thus for a thin-film Li-ion battery, the capacity will be determined in the same way the current capability of the PV cell is determined—by the area of the device. The size also impacts the rate at which a battery can be charged and discharged (i.e., the smaller the battery the smaller the charging and discharging currents it can handle).

Ideally, in order to minimize the control electronics associated with a battery, the photovoltaic array should be designed such that its output voltage matches the voltage needs of the battery and its current output is sufficient to charge the battery while simultaneously providing power to the load. The precise sizing of the array and battery will also be dependent on the duration of shadow.

The matching of the solar array and batteries for these small power systems is essential as the parasitic power loss in a conventional charge controller normally used in a larger power system might actually exceed the output of a small IPS. Once the PV and battery are matched, the only additional components required are a blocking diode if it is desired to prevent the battery from discharging through the PV array during eclipse.

The Li-ion batteries play a large role in determining the temperature regime in which these systems are suitable. Li-ion cells will deliver a sizeable fraction (i.e. 80%) of their capacity at temperatures as low as −20° C. Below such a temperature they do not perform well. However, they do not exhibit permanent damage if they are cycled between larger temperatures regimes (i.e., plus or minus 80° C.). The high temperature performance is much less of an issue with thin-film Li-ion batteries as they have been shown to operate well at temperatures up to 60° C.

The invention has been described hereinabove using specific examples and embodiments; however, it will be understood by those skilled in the art that various alternatives may be used and equivalents may be substituted for elements or steps described herein, without deviating from the scope of the invention. Modifications may be necessary to adapt the invention to a particular situation or to particular needs without departing from the scope of the invention. It is intended that the invention not be limited to the particular implementation described herein, but that the claims be given their broadest interpretation to cover all embodiments, literal or equivalent, covered thereby.

What is claimed is:

1. A method of protecting a photovoltaic array from damage from partial shading, said method comprising the steps of:

providing a photovoltaic array comprised of a plurality of modules connected in series for providing an electric current, wherein each of said modules includes a rechargeable battery having at least one rechargeable cell connected in parallel with a photovoltaic battery having at least one photovoltaic cell;

utilizing a light source for lighting said array, wherein, during a temporary shading of one or more, but not all, of said modules, the remainder of said modules remain lit by the light source; and each of said batteries included in said one or more shaded modules shunting at least some portion of said electric current during said temporary shading without using a diode for blocking current flow through the corresponding photovoltaic battery, wherein said shunting protects said array from hot-spot damage.

2. The method of claim 1, wherein said at least some portion of said current is a majority of said current, and wherein said batteries are sized for carrying said majority of said current without damage.

3. The method of claim 1, wherein said batteries are sized with a storage capacity sufficient for providing energy during the period of the temporary partial shading of said array, but not sufficiently large for providing energy during a substantial majority of an eclipse or nighttime period.

4. The method of claim 1, wherein said array is mounted on a spacecraft placed in orbit around a body, and wherein said temporary shading is due to a part of the spacecraft at least partially blocking light from part of said array.

5. The photovoltaic array of claim 1, wherein said photovoltaic battery is comprised of one or more photovoltaic cells and wherein said photovoltaic cells and said rechargeable battery are thin-film devices integrated on a common substrate.

6. A method of protecting a photovoltaic array from damage due to temporary partial shading of said array, said method comprising the steps of:

providing a photovoltaic battery including at least one photovoltaic cell;

providing a rechargeable battery including at least one rechargeable cell, said rechargeable battery electrically connected across said photovoltaic battery without a diode for blocking a current through said photovoltaic battery;

and operating said array such that said rechargeable battery shunts at least a portion of a current of said array from said photovoltaic battery to protect said photovoltaic battery from damage when said photovoltaic array is at least partially shaded.

7. The method of claim 6, further comprising the step of sizing said rechargeable battery with a storage capacity sufficient for providing energy during a period of the temporary partial shading of said array, but not sufficiently large for providing energy during most of an eclipse or nighttime period.

8. The method of claim 6, wherein said photovoltaic array is mounted on a spacecraft placed in orbit around a body, and wherein said shading is due to a part of the spacecraft at least partially blocking light from said array.

9. The photovoltaic array of claim 6, wherein said photovoltaic cell and said rechargeable cell are thin-film devices integrated on a common substrate.

10. A method of providing power to an orbiting craft using a photovoltaic array protected from damage by partial shading, said method comprising the steps of:

providing a photovoltaic array on said orbiting craft and comprised of a plurality of modules connected in series for providing an electric current, wherein each of said modules includes a rechargeable battery having at least one rechargeable cell connected in parallel with a photovoltaic battery having at least one photovoltaic cell;

utilizing a light source for lighting said array in orbit during a normal phase;

operating said array in orbit during a shading phase wherein one or more, but not all, of said modules are shaded and the remainder of said modules remain lit by the light source;

protecting said array during said shading phase by each of said batteries included in said one or more shaded modules maintaining a protective voltage across said shaded modules to prevent hot-spot damage to the photovoltaic batteries in said shaded modules without using a diode for blocking current flow through the corresponding photovoltaic battery.

* * * * *